United States Patent [19]
Droz

[11] Patent Number: 5,399,847
[45] Date of Patent: Mar. 21, 1995

[54] CARD COMPRISING AT LEAST ONE ELECTRONIC ELEMENT

[76] Inventor: François Droz, Rue de la Prairie 46, CH-2300 La Chaux-de-Fonds, Switzerland

[21] Appl. No.: 59,664

[22] Filed: May 12, 1993

[30] Foreign Application Priority Data

May 19, 1992 [FR] France .................. 92 06169

[51] Int. Cl.⁶ .............. G06K 19/02; G06K 19/00; G06K 19/06
[52] U.S. Cl. .................. 235/488; 235/492; 235/487; 361/737
[58] Field of Search .............. 257/531, 679; 235/488, 235/487, 449, 492; 174/17 R, 17.05, 50.5, 50.54, 50.62, 50.64, 52.1, 52.2, 52.3, 52.4; 437/925, 978; 361/737

[56] References Cited

U.S. PATENT DOCUMENTS

| | | | |
|---|---|---|---|
| 4,138,696 | 2/1979 | Blazevic | 235/449 X |
| 4,758,689 | 7/1988 | Nakao et al. | 235/488 X |
| 4,795,898 | 1/1989 | Bernstein et al. | 235/488 X |
| 4,988,853 | 1/1991 | Nagashima et al. | 235/449 X |
| 5,067,008 | 11/1991 | Yanaka et al. | 257/679 |

FOREIGN PATENT DOCUMENTS 0350179 1/1990 European Pat. Off. .
2520541 7/1983 France .

OTHER PUBLICATIONS

K. P. Stuby, IBM Technical Disclosure Bulletin, "Flexible Semiconductor Credit Card", Nov. 1979, vol. 22 No. 6, pp. 2336–2337.

*Primary Examiner*—Donald Hajec
*Assistant Examiner*—Jeffrey R. Filipek
*Attorney, Agent, or Firm*—Griffin, Butler, Whisenhunt & Kurtossy

[57] ABSTRACT

A card comprising an electronic element (2) and a coil (42) having its ends directly coupled to the electronic element are encased in a binding material (10). A positioning structure (46) for the electronic element is located in a layer (38) formed by the binding material.

14 Claims, 4 Drawing Sheets

CARD COMPRISING AT LEAST ONE ELECTRONIC ELEMENT

FIELD OF THE INVENTION

The present invention concerns a card comprising at least one electronic element.

More specifically, the present invention concerns a card exhibiting no exterior contact.

The card according to the invention may, for example, be used as a bank card, as access card to a locked enclosure or again, in association with a merchandise distributor. Such a card may also be used as means of identification or for checking.

It is understood by card any object having a substantially planar structure defining a general plane and exhibiting any contour whatsoever in such general plane.

BACKGROUND OF THE INVENTION

To the person skilled in the art there is known a card comprising electronic elements and formed of a shell in which are provided housings intended to receive such electronic elements and an outer protective layer which closes the housings.

There is also known a card having a symmetrical structure and formed of two shells substantially similar to one another, each of such shells having a structured surface serving to form housings intended to receive electronic elements when the two shells are assembled.

The method of manufacture of such latter card is generally the following:

initially, each shell is manufactured with the help of an injection technique, for example by hot moulding;
  secondly, the electronic elements are placed in one of the two shells and the other shell is thereafter placed on the first, the whole being assembled by a hot welding technique.

Manufacture of the card described hereinbefore exhibits several difficulties.

In particular, following the hot assembly of the two shells, the electronic elements only partially fill the housings. This has as a consequence that the card exhibits fragile zones in places where the housings are situated, especially when the electronic elements incorporated in the card have relatively large dimensions. It is thus that when there is provided a coil of a diameter on the order of magnitude of the card, such a manufacturing method generates deformed zones (bulging or hollow) on the outer faces of the card such being naturally detrimental for the surface evenness of the card and for the printing which may be provided on the outer surfaces of such card.

There is further known from patent document EP-0 350 179 a method of manufacture of the card consisting in placing in a mould two outer layers and an electronic assembly, then injecting a filling material in liquid form in such mould. Once hardened, such filling material forms an intermediate layer between the two outer layers.

In order to increase the speed of production, two chains are provided, each comprising several half moulds coupled to one another. Such two chains are adapted to have a vertical motion and to form with two corresponding half-moulds belonging respectively to the two chains a mould exhibiting an opening at least on the upper part thereof in order to permit the filling thereof. Above the place where the two corresponding half-moulds are assembled to form a mould, there is provided a nozzle permitting the injection of the filling material in liquid form into the newly formed mould.

The method of manufacture of a card described hereinbefore is complicated. Additionally, for large production outputs, such method of manufacture necessitates substantial equipment which renders it burdensome.

It will be further noted that bringing in the electronic assembly and positioning it during the injection are in no manner described in the document considered here and are not evident. It is the same for bringing the outer layers into the half-moulds.

The card obtained by the method of manufacture described hereinbefore and such as described in patent document EP-0 350 179 is formed essentially of three layers, namely, an intermediate layer and two outer layers. Within the intermediate layer is provided an electronic assembly formed of electronic elements, a coil arranged on its own support and an interconnection support, such interconnection support serving to couple the electronic elements and the coil electrically and rigidly.

A major difficulty of such card arises from the fact that the interconnection support and the coil support increase the thickness of the card. Thus it is difficult to obtain a thin card having a thickness of 0.76 mm as prescribed by the ISO standard currently used for bank cards.

It will be noted furthermore that the method of manufacture proposed for such card does not assure that the interconnection support and the neighbouring outer layer are separated by a layer of filling material which is detrimental for good adhesion of such outer layer to the intermediate layer. Furthermore, such method of manufacture does not guarantee good positioning of the electronic assembly at the heart of the intermediate layer.

The present invention has as purpose to overcome the difficulties described hereinbefore in proposing a card with at least one electronic element included in the interior thereof and obtainable at a low manufacturing cost.

SUMMARY OF THE INVENTION

An object of the present invention thus concerns a card comprising at least one electronic element, a coil and a layer formed by a binding material, such card being characterized in that said coil has two ends for electrical coupling directly connected to said electronic element, such latter forming together with said coil, an assembly embedded in said binding material forming said layer.

There results from these characteristics that the card may be very thin and its thickness may be scarcely greater than that of the assembly formed by the coil and the electronic element when it is formed only by a single layer of binding material incorporating said assembly. Next, the card according to the invention is not very costly. Furthermore, said assembly is correctly protected by the binding material which assures a long life for the card.

Another object of the present invention concerns a card comprising at least one electronic element and a layer of binding material in which is embedded the electronic element, such card being characterized in that it comprises a positioning structure located within said layer of binding material, such positioning structure having at least one principal opening defining an internal zone within which is located said electronic element.

By way of example, the binding material is a resin, in particular a blend of copolyamides or a glue having two components, of polyurethane or of polyvinyl chloride.

There results from the characteristics hereinbefore mentioned that the positioning structure defines, within the layer formed by the binding material, an internal zone within which the electronic element is located. Additionally, such positioning structure enables diminishing the volume of binding material necessary and it is advantageous for the manufacture of such card as such is described hereinafter in the method of manufacture according to the invention.

By way of example, the positioning structure is formed either by a full or perforated frame or by a corrugated leaf, or again by a thin structure, the upper and lower faces of which are knurled or embossed, such two faces exhibiting for example a relief composed of several pyramids.

According to specific characteristics of the invention, the card comprises first and second outer layers adhering solidly to said binding material, said layer formed by said binding material constituting an intermediate layer between said first and second outer layers, at least the major portion of the internal surface of each of such first and second outer layers being covered over by said binding material, such latter assuring cohesion of such first and second outer layers with said intermediate layer.

In an embodiment of the invention including the specific characteristics mentioned hereinbefore, there is provided a positioning structure formed by a thin structure having an upper face and a lower face exhibiting a relief, the points of such thin structure situated furthest out from its median plane forming contact points with the internal surfaces of the outer layers.

Thanks to this latter characteristic, it is possible to assure a very good parallelism between the two outer layers which leads to a constant thickness of the card. Additionally, such specific characteristic is advantageous for the manufacture of the card as such is described hereinafter in the method of manufacture according to the invention.

In another embodiment, the card according to the invention comprises at least one electronic element embedded in a binding material partially forming such card, such latter being characterized in that it additionally comprises a support formed by a base defining a first outer layer and by a positioning structure extending from such base, said binding material covering over in superposition at least the major part of said base, said positioning structure defining an internal zone within which is located said electronic element.

In a variant of such latter embodiment, the card further comprises a second outer layer arranged facing said base and having an internal surface at least the major part of which is covered over by said binding material, such outer layer and said base defining an intermediate region in which are located said positioning structure and said electronic element.

The present invention has also as an object a method of manufacture of a card comprising at least one electronic element characterized in that it includes the following steps:

IA) bringing, onto a work surface, a first outer layer formed by a solid material;

IB) placing said electronic element on said first outer layer;

IC) applying a binding material on said first outer layer;

ID) bringing facing said first outer layer and onto said binding material a second outer layer formed of a solid material;

such steps being followed by the following step:

IE) applying pressure on said first and second outer layers until such first and second outer layers are located at a predetermined distance relative to one another, said binding material then forming between such first and second outer layers a layer having a predetermined thickness.

There results from these characteristics described hereinbefore a method of manufacture of a card according to the invention which necessitates neither machining of the outer layers nor of having shells preformed by an injection technique. The various steps of the method of manufacture of the card according to the invention are simple and it is possible to produce cards according to the invention in large quantities for low cost. Furthermore, it is possible to manufacture cards according to the invention without applying heat, this avoiding the problems of shrinkage of material which can occur in hot assembly techniques.

The method according to the invention enables manufacturing cards which are compact and filled in, that is to say, exhibiting an internal residual air volume which is very small.

According to another characteristic of the method of manufacture of a card according to the invention, it is provided to place a positioning structure, exhibiting an internal zone on the interior of which the electronic element is positioned, facing the first outer layer.

This supplementary characteristic enables positioning the electronic element in a predefined internal zone of the layer formed by the binding material, such positioning structure preventing said electronic element from coming out of the intermediate region defined between the internal surfaces of the first and second outer layers, especially during step IE.

In a special method of practising the invention, there is provided a thin positioning structure, the upper face and the lower face of which each show a relief, the points of such structure situated furthest out from its median plane defining a thickness substantially equal to the final thickness foreseen for the layer formed by the binding material. Such positioning structure thus permits defining the thickness of the layer of binding material during step IE during which the first and second outer layers are pressed towards one another. In this latter case, the positioning structure thus has a positioning function and a defining function for the thickness of the layer formed by the binding material and consequently of the thickness of the card.

According to another characteristic of the method of manufacture of a card according to the invention, said binding material as applied is formed by a viscous liquid, such liquid hardening preferably at ambient temperature following said step IE.

There results from this characteristic that the binding material may spread out in a manner to fill uniformly the intermediate region and envelop the elements which it contains in order to form the layer of binding material.

In the case in which the positioning structure is formed either by cellular material such as a foam or by a thin structure exhibiting a relief on its upper and lower faces, the diffusion of the binding material is facilitated and an excess of binding material applied may be easily removed which prevents any harmful excess pressure during the pressing of the two outer layers.

In particular, in the case in which the positioning structure is formed by a full frame or in the case in which the electronic element is arranged with other electronic elements on a substrate, it is provided according to a special putting into practice of the method according to the invention, that the application of the binding material is effected in two phases. The first phase consists in an application of a first portion of the binding material on said first outer layer prior to the placing of the electronic element and of the positioning structure in the case in which such latter is provided. The second phase consists in applying the second portion of the binding material once the electronic element and, where applicable the positioning structure, are brought in and arranged on the first portion of the binding material.

Such application of the binding material in two phases enables guaranteeing that the various elements contained in the layer of binding material are entirely enveloped by the binding material, the internal surfaces of the two outer layers being entirely covered over by the binding material which assures a very good cohesion between the layer of binding material and the two outer layers and thus a very good cohesion of the card in its overall assembly.

In another manner of putting into practice the manufacture of a card according to the invention, it is foreseen to utilize a technique requiring an application of energy. In this latter case the binding material as applied is formed at least partially by a solid leaf, such leaf being thereafter melted at least partially by application of energy in a manner to form the intermediate layer following cooling of the binding material.

The application of energy serving to melt the leaf may be simultaneous with step IE during which the two outer layers are pressed towards one another.

Finally, according to another manner of putting into practice the method of manufacture of a card having no outer layers, it is foreseen to apply the electronic element, the positioning structure and the binding material directly onto a work surface, non-adhesive to such binding material. Next the binding material is pressed with the help of a press exhibiting a contact surface with the binding material, likewise non-adhesive to such latter.

The card resulting from such latter manner of putting into practice possesses a single layer formed by the binding material. Such card may be utilized as a constitutive element in the manufacture of another card possessing two outer layers or a shell with a housing preformed in order to receive such card.

It will be noted that the contour of the card according to the invention seen from above may be any form whatsoever and for example circular or rectangular.

Other purposes, characteristics and advantages of the invention will be further set forth with the help of the description which follows, having reference to the annexed drawings which are given solely by way of example.

DESCRIPTION OF THE PREFERRED EMBODIMENTS

Figure 1:
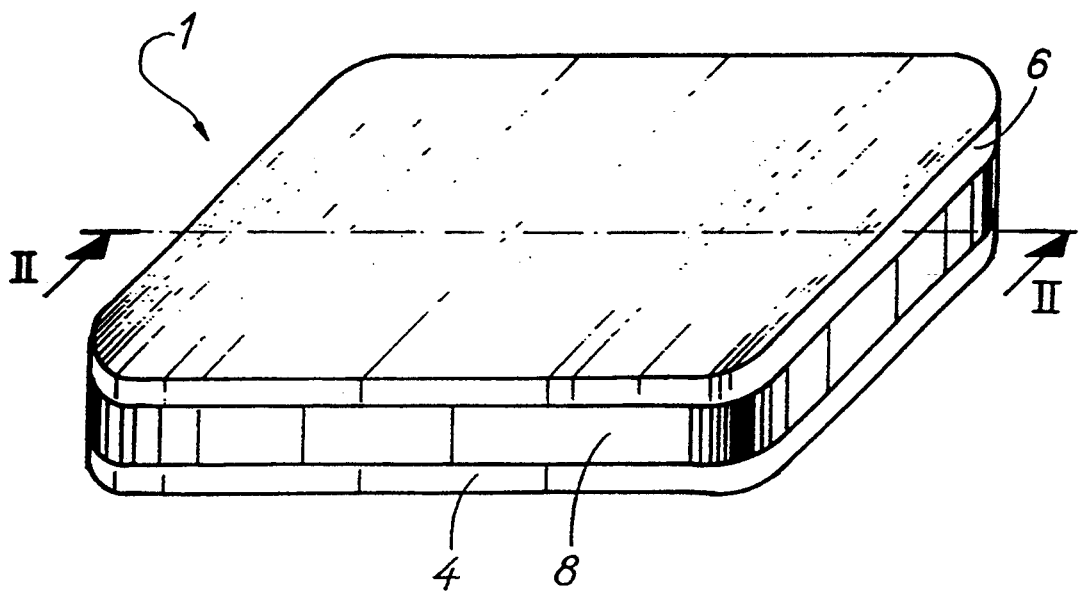
FIG. 1 is a perspective view of a card according to a first embodiment of the invention.

In referring to FIGS. 1 to 3, there will be described hereinafter a first embodiment of a card according to the invention, comprising at least one electronic element.

Card 1 comprises three layers, namely a first outer layer 4, a second outer layer 6 and an intermediate layer 8. The intermediate layer 8 is formed by a binding material 10 encasing the electronic element 2 and a coil 12. It will be noted that coil 12 and the electronic element 2 are directly connected to one another and thus form an assembly 14, this latter being embedded in the binding material 10.

The binding material 10 is chosen in a manner such that it adheres properly and rigidly to the outer layers 4 and 6. It thus assures the cohesion of the assembly of the elements of the card and in particular of the two outer layers 4 and 6 with the intermediate layer 8.

From the fact that coil 12 is directly soldered to the electronic element 2 without having such assembly arranged on a support, it is possible to obtain cards the thickness of which is very small.

The binding material 10 which encases the assembly 14 is made up for example from a resin or a plastic material, these two examples naturally being non-limiting. In particular, the resin may be a blend of copolyamides or a glue having two components, or again a glue hardening upon contact with air. The outer layers 4 and 6 are made up for example by a type of polyvinyl chloride or by polyurethane, these examples being likewise non-limiting.

It will be noted that this card is compact and that the outer layers 4 and 6 are formed by entirely flat leaves. The binding material 10 and the assembly 14 entirely fill the intermediate region located between the outer layers 4 and 6 in order to form the intermediate layer 8.

In referring to FIGS. 4 and 5, there will hereinafter be described a second embodiment of a card according to the invention.

Card 31 according to this second embodiment comprises two outer layers 4 and 6, each comprising an internal surface 59 and 60 and an intermediate layer 38 located between the outer layers 4 and 6.

An assembly 44, formed by an electronic element 2 connected to a coil 42 and a positioning structure 46 formed by a plate exhibiting a principal opening 48 on the interior of which is located said assembly 44, are embedded in the binding material 10 and form with this latter the intermediate layer 38.

This structure 46 defines, thanks to the principal opening, an internal zone for the assembly 44 in the intermediate layer 38.

Figure 4:
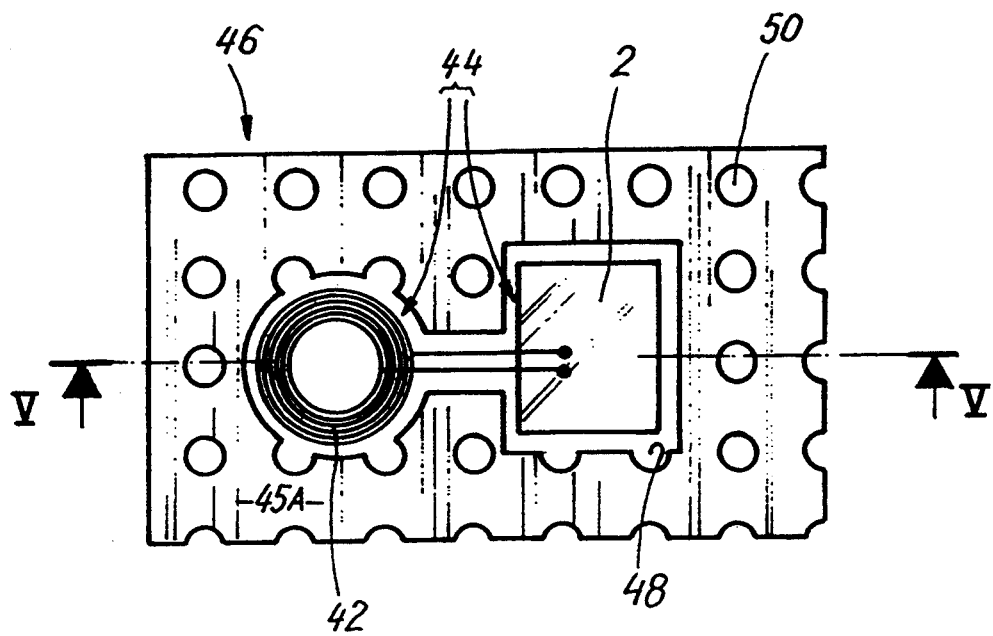
FIG. 4 is a schematic view from above of a positioning structure and of an assembly formed from an electronic element and a coil comprised in the layer of binding material of the card shown on FIG. 5.
Figure 5:
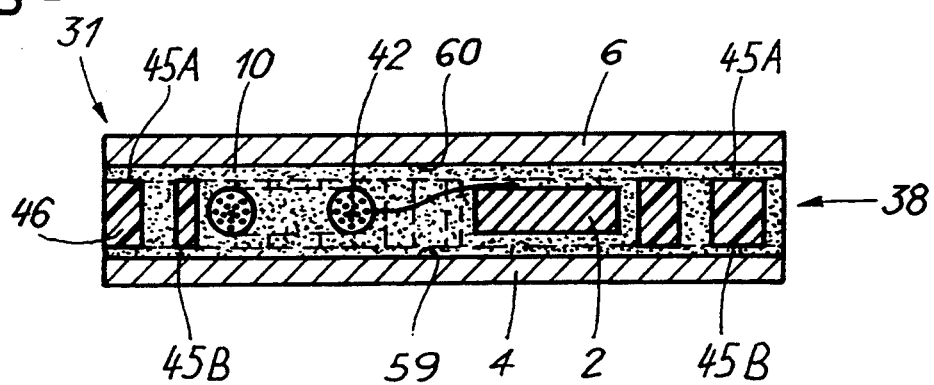
FIG. 5 is a view similar to FIG. 2, but showing a card according to a second embodiment of the invention including the positioning structure and the assembly of FIG. 4 which here are shown according to a cross-section taken along line V—V of such FIG. 4.

It will be noted that the electronic element 2 is located in FIG. 4 outside of the region delimited by the coil 42. This configuration is equally possible for each of the embodiments of the card according to the invention.

It will be further noted that the plate forming the positioning structure 46 includes perforations 50 filled up by the binding material 10. Such perforations in particular enable the binding material 10 to flow from one side to the other of the positioning structure 46 during manufacture of such card according to a method likewise forming an object of the invention and which will be described hereinafter.

Binding material 10 encases entirely the assembly 44 and covers over completely the upper face 45A and the lower face 45B of the positioning structure 46. The intermediate layer 38 thus forms a compact amalgam and the internal surfaces 59 and 60 of the two outer layers 4 and 6 are entirely covered over by the binding material 10 which assures a maximum adhesion surface between the intermediate layer 38 and the outer layers 4 and 6.

In referring to FIGS. 6 and 7, there will be described hereinafter a third embodiment of a card according to the invention.

Card 61 according to this third embodiment comprises an intermediate layer 58 located between two outer layers 4 and 6 and in which is incorporated a positioning structure 62. Such positioning structure 62 exhibits a principal opening 63 in which is located the assembly 14 formed by the electronic element 2 and the coil 12 such as shown on FIG. 3.

The positioning structure 62 exhibits the general form of a frame defining in the interior thereof an internal zone for assembly 14. Such positioning structure 62 is formed by a thin structure exhibiting on its upper face 66 and on its lower face 64 a relief composed of pyramids 68. The exterior points 70 of the positioning structure 62 are slightly crushed and are in contact with the internal surfaces 59 and 60 of the two outer layers 4 and 6. It is possible to provide a thickness for the positioning structure 62 which corresponds exactly to the thickness provided for the intermediate layer.

Such third embodiment presents an additional advantage given that the positioning structure 62 serves not only to define positioning of the assembly 14 in an internal zone of the intermediate layer 58, but further to define the thickness of such intermediate layer 58. This additional advantage is appreciable, particularly during manufacture of such a card according to a method also forming an object of the present invention.

It will be noted that the exterior points 70 of pyramids 68 serve as support points for the outer layers 4 and 6, the region neighbouring such points 70 being filled up by the binding material 10. This assures good adhesion of the outer layers 4 and 6 to the intermediate layer 58, given that the major portion of the internal surfaces 59 and 60 is covered over by the binding material 10, which assures good cohesion of the intermediate layer 58 with the outer layers 4 and 6.

It will be noted that the relief provided on the upper face 64 and on the lower face 66 of the positioning structure 62 may be formed by a substantial variety of different patterns, each of such patterns being conceived in a manner such that the major portion of the internal surfaces 59 and 60 of the outer layers 4 and 6 is covered over by the binding material 10 from the intermediate layer 58. The intermediate structure may be manufactured in various manners and in particular by knurling or embossing.

In a variant of this embodiment the intermediate structure is formed by a corrugated leaf. Such corrugated leaf may be flexible or rigid. Additionally, such corrugated leaf may exhibit perforations or be porous to the binding material 10.

It will be further noted that it is possible to provide perforations (not shown) in the positioning structure 62 as in the case of the second embodiment.

In referring hereinafter to FIG. 8, there will be described a fourth embodiment of a card according to the invention.

Card 81 according to such fourth embodiment comprises two outer layers 4 and 6 and an intermediate layer 88 formed by a binding material 10 encasing at least one electronic element 2 and a positioning structure 90. Such positioning structure 90 is formed in particular by a cellular structure in the interior of which is provided a principal opening defining an internal zone in which is arranged at least one electronic element 2. The positioning structure 90 may also be formed by an expanded material as for example a foam, exhibiting a rigid or flexible structure. It may also be formed by a woven synthetic material.

The binding material 10 penetrates the positioning structure 90 in a manner to form an amalgam substantially full. As in the preceding embodiments, the intermediate layer 88 forms a homogeneous and compact medium. Furthermore the binding material 10 defines a fixed and stable place for the electronic element 2 as well as, when called for, for all other elements incorporated in the intermediate layer 88. The various elements provided in the intermediate layer 88 are set in the binding material 10 which thus assures a rigid mechanical coupling between such various elements.

Figure 9:
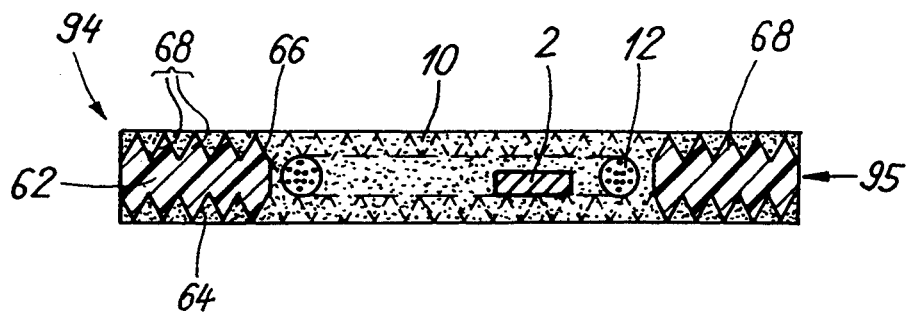
FIG. 9 shows in cross-section a card according to a fifth embodiment of the invention.

Referring hereinafter to FIG. 9, there will be described a card according to a fifth embodiment of the invention.

Figure 7:
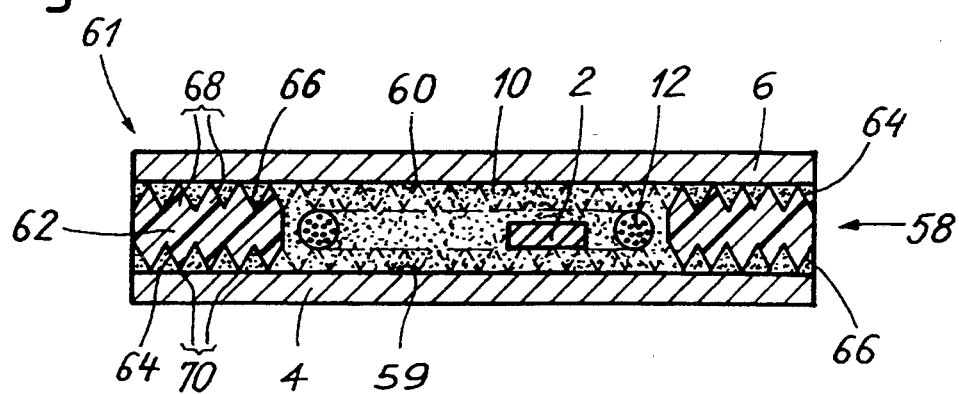
FIG. 7 is a view similar to FIG. 5, but showing a card according to a third embodiment of the invention including the elements of FIG. 6, here shown according to a cross-section taken along line VII—VII of such FIG. 6.

Such card 94 is constituted by a layer 95 analogous to the intermediate layer 58 of card 61 of FIG. 7. Such card 94 is thus formed by a binding material 10 encasing an electronic element 2, a coil 12 and a positioning structure 62 exhibiting a relief with pyramids 68 on its lower face 64 and its upper face 66.

It will be noted that in other variants of this embodiment of a card according to the invention, such latter is constituted by a single layer analogous to the intermediate layer of any of the embodiments of a card according to the invention, as described hereinbefore.

Card 94 may be used as a constitutive element of a card according to one of the other embodiments described hereinbefore. Such card 94 may also be integrated into other arrangements or objects.

Figure 10:
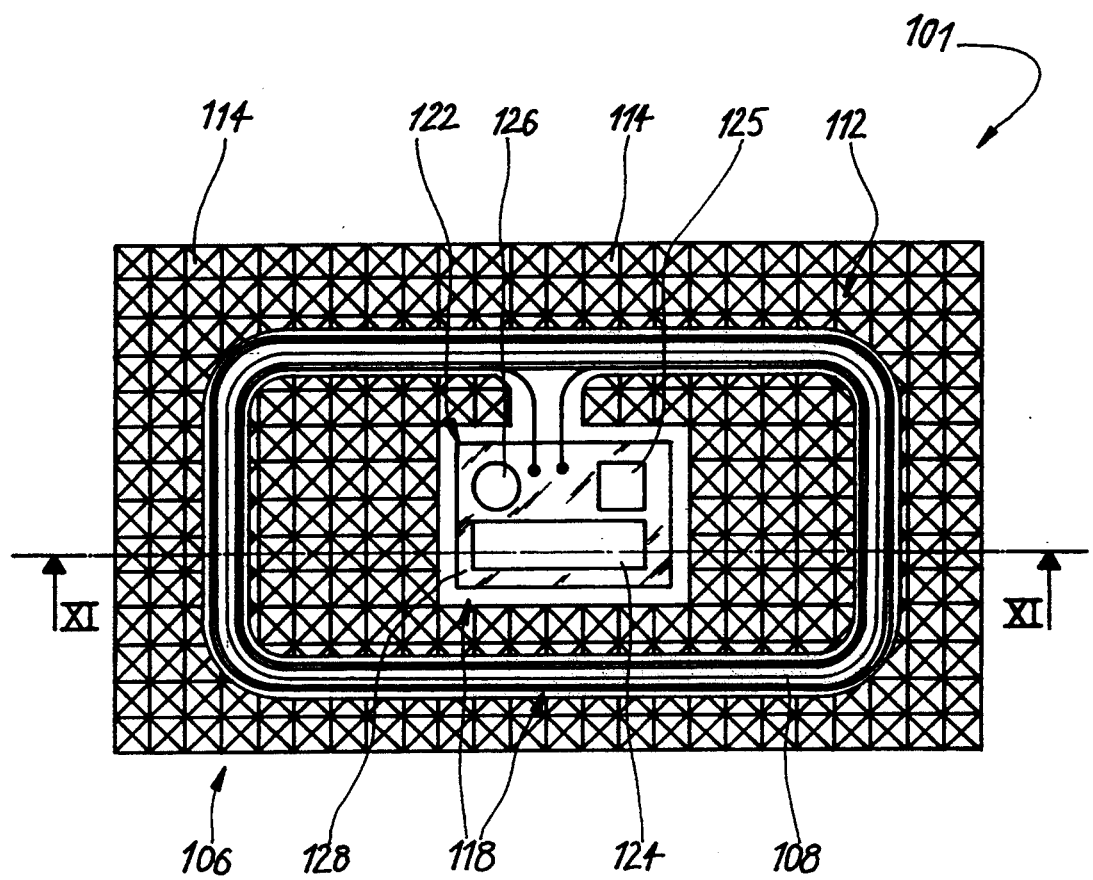
FIG. 10 is a schematic plan view of a sixth embodiment of a card according to the invention, taken along line X—X of FIG. 11.
Figure 11:
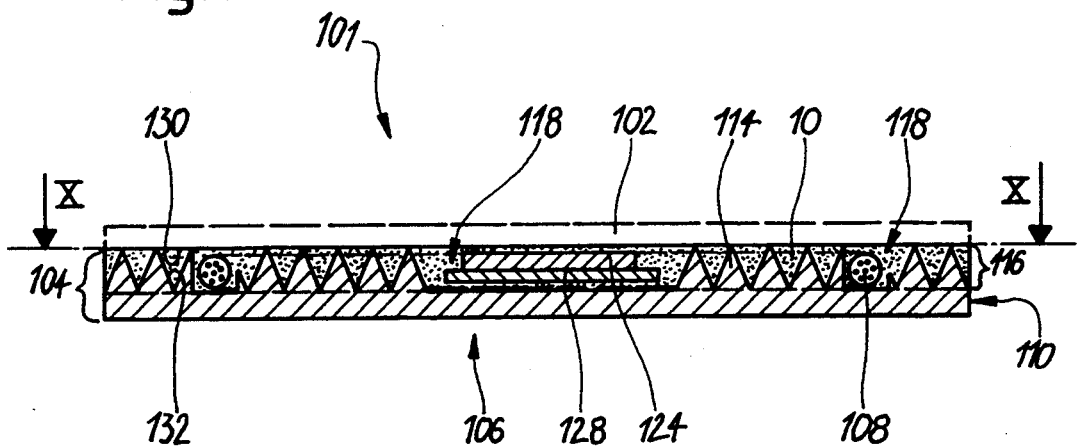
FIG. 11 is a cross-section of the card of FIG. 10 taken along line XI—XI of such FIG. 10.

Referring to FIGS. 10 and 11, there will be described hereinafter a sixth embodiment of a card according to the invention.

Such card 101 comprises an outer layer 102 and a layer 104 formed by a support 106 and a binding material 10.

Support 106 is formed from a base 110 and from a positioning structure 112 extending from base 110 into the intermediate region 116 of card 101. The base 110 defines an outer layer of the card and the binding material 10 filling the space left free in the intermediate region 116 forms an intermediate layer of such card.

The positioning structure 112 is practically entirely covered over by the binding material 10 and it defines an internal zone 118 within the intermediate region 116 intended to receive a coil 108 and an electronic unit 122 made up of various electronic elements 124, 125 and 126. Such electronic elements 124, 125 and 126 are arranged on a substrate 128. Such substrate 128 also includes two terminals for connection with the two electrical coupling ends of coil 108. It will be noted that this latter is not arranged on substrate 128 of the electronic assembly 122 nor superposed on such substrate 128.

The positioning structure 112 serves to bound the internal zone 118 within the card 101 on the interior of which the various electronic elements are positioned. Such positioning structure 112 is made up of pyramids 114. This embodiment of the positioning structure 112 is given solely by way of non-limiting example. In effect, the relief of the positioning structure 112 may take any form whatsoever to the extent that the volume filled up by the binding material 10, as in the other embodiments, is bounded by a surface in which a continuous or almost continuous zone partially defining the lateral faces of the card according to the invention is laterally developed over the entire periphery of the card. In other terms, the binding material 10 partially forming the intermediate region 116 must cover over the quasi totality or the totality of the internal surface 130 of the outer layer 102 and the internal surface 132 of base 106, at least over the entire peripheral region of card 101.

It will be noted that in a variant of this embodiment the first outer layer 102 is omitted, the card then being formed solely by layer 104 encasing entirely the positioning structure 112.

It will be also noted that in other variants of this embodiment, the electronic unit 122 is located outside of the region delimited by the coil 108. Further, the positioning structure 112 can only be located either inside of the region delimited by the coil 108 or outside of this region.

The sixth embodiment of a card according to the invention is distinguished essentially from the other embodiments described previously by the fact that the positioning structure 112 forms together with base 110 a single piece. Such piece may be obtained in various manners and in particular by knurling, by embossing or by injection.

Hereinafter there will be described a method of manufacture of a card according to the invention and having reference to FIGS. 1 to 11.

According to a first manner of putting into practice the method according to the invention, a first outer layer 4 is brought onto a work surface and at least one electronic element 2 is placed thereon. A binding material 10 serving to form an intermediate layer 8, 38, 58, 88 is applied onto the first outer layer 4 in a liquid state. A second outer layer 6 is furnished in a manner to cover the binding material and the various elements provided in the intermediate layer. The binding material 10 is applied preferably at a temperature lower than the melting temperature of the outer layers 4 and 6 and, in particular, at ambient temperature.

Next, the outer layers 4 and 6 are pressed towards one another with the help of a press. During this step of application of pressure, the binding material 10 is spread out in the entire intermediate region located between the outer layers 4 and 6 in a manner to fill it up without leaving substantial air pockets and to encase all the elements placed on the first outer layer 4.

In an advantageous manner, the binding material exhibits a viscosity sufficiently high so as to spread out in a substantial manner only during application of pressure. The consistency of the binding material is chosen in a manner such that it will not deteriorate the electronic element 2 placed on the first outer layer 4, nor coil 12 in the case where such latter is provided. By way of non-limiting examples, the binding material 10 is formed by a resin or a variety of polyvinyl chloride which may be applied in the form of a liquid at a temperature lower than the melting temperature of the two outer layers 4 and 6.

In a variant of such first putting into practice of the method, it is provided that a positioning structure 46, 62, 90 is initially brought onto the first outer layer 4. The various elements, other than this positioning structure, foreseen for the intermediate layer are next placed within at least one principal opening 48, 63 provided in such positioning structure. Thus, during the pressing step during which the binding material 10 is spread entirely throughout the intermediate region, each element is maintained in a predefined internal zone of such intermediate region with the help of the positioning structure, so that the several elements are not carried away by the spreading out of the binding material in the general plane of the card.

It will be noted that the positioning structure 46, 62, 90 enables lateral flow of binding material 10, that is to say, a flow in the general plane of the card according to the invention. Thus, each of the intermediate structures proposed enables, on the one hand, to maintain the electronic elements in a predefined internal zone of the intermediate region during manufacture of the card according to the invention and, on the other hand, a flow of binding material 10 into all of such intermediate region in order to form the intermediate layer. Additionally, it enables that an excess of binding material applied may escape out of the defined intermediate region between the outer layers 4 and 6.

It will be noted that the perforations 50 provided in the positioning structure 46 enable the binding material 10 to flow from one side to the other of such positioning structure. Such perforations avoid that the binding material is spread out over one side only of the positioning structure 46. One thus assures that the binding material 10 entirely fills the remaining space in the intermediate region.

It will also be noted that the application of binding material may precede the bringing in of various elements and structures incorporated in the intermediate layer.

In another variant of this first manner of putting into practice of the method according to the invention, it is provided to apply a first portion of the binding material 10 before the steps of placing the various elements and of the positioning structure on the first outer layer 4, a second portion of binding material then being applied after such placing steps. Thus, one is assured that the various elements and the positioning structure included in the intermediate layer are correctly encased by the binding material 10 in a manner such that the internal surfaces 59 and 60 of the outer layers 4 and 6 are almost entirely covered over by the binding material 10, which assures good cohesion of the intermediate layer with the outer layers.

Figure 6:
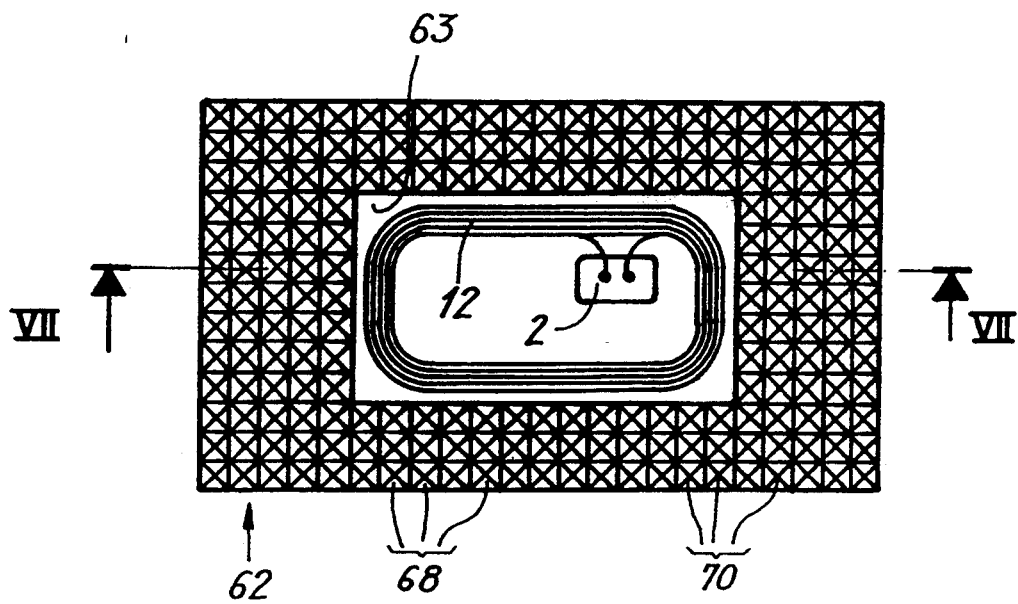
FIG. 6 is a schematic view from above of a positioning structure and of an assembly formed from an electronic element and a coil included in the layer of binding material of the card shown on FIG. 7.

In the case where one has available a positioning structure 62 as shown on FIGS. 6 and 7, the outer layers 4 and 6 are pressed towards one another until they touch points 70 of pyramids 68 which are located on either side of such positioning structure 62. The positioning structure can in this latter case initially exhibit a thickness slightly greater than the desired thickness for the intermediate layer 58, the points 70 of pyramids 68 of the positioning structure 62 then being slightly crushed during the pressing step.

Figure 2:
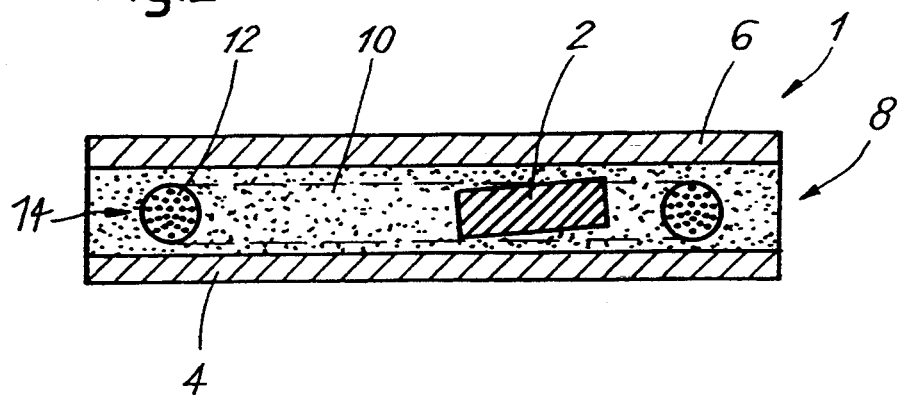
FIG. 2 is a cross-section view of the card of FIG. 1 taken according to line II—II of such FIG. 1.
Figure 3:
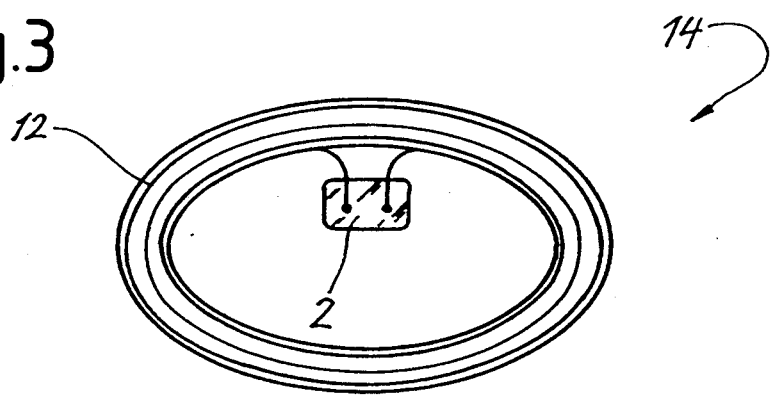
FIG. 3 shows schematically and in perspective an assembly formed from an electronic element and a coil.

It will be herein noted that it is also possible to obtain a card without a positioning structure incorporated in the intermediate layer as is shown on FIG. 2 in providing during the manufacture of such a card a working frame exhibiting an opening having the same dimensions as those of the card itself. The working frame can, for example, exhibit a structure similar to the positioning structure 62 shown on FIG. 6.

There will be hereinafter described a second manner of putting into practice the method of manufacture of a card according to the invention.

In this second manner of putting into practice, a first outer layer 4 is brought into play and thereabove there is arranged at least one electronic element 2 and a positioning structure comprising a principal opening within which the electronic element 2 is placed. The binding material 10 is applied in a solid state, for example in leaf form and it is arranged either on the positioning structure and on the various elements placed on the first outer layer 4, or directly on such first outer layer. Next, a second outer layer 6 is brought into play. Finally, the energy necessary to melt at least partially the binding material is applied with the help of a heating press. The binding material thus penetrates the positioning structure and encases the various elements incorporated in the intermediate layer. The application of energy and pressing the outer layers may be synchronized so that the binding material 10 melts in an optimum manner.

In a variant of this second manner of putting into practice, it is foreseen to apply the binding material in the form of two thin leaves arranged on either side of the positioning structure and of the various elements incorporated in the intermediate layer. Thus, when the binding material is melted and the outer layers are pressed towards one another, it is assured that the binding material entirely fills the intermediate region in covering over almost entirely the positioning structure and the various incorporated elements.

Again, the intermediate structure 46, 62 or 90 enables the binding material to have a lateral flow, an excess of binding material thus being able to escape out of the intermediate region. Additionally, the intermediate structure assures, in case of necessity, maintenance of the leaf of binding material arranged thereon. Thus, during application of heat, the binding material penetrates the positioning structure in a uniform manner.

It will also be noted that in the case where two leaves of solid binding material are applied on either side of the positioning structure, it is not absolutely necessary to melt such binding material until it becomes liquid.

It is sufficient to render it soft enough so that it fills entirely the intermediate region so as to form, with the various elements and the positioning structure, the intermediate layer.

It is also possible, according to another variant of such second manner of putting into practice the method according to the invention, to arrange in advance on each of the internal surfaces 59 and 60 of the two outer layers 4 and 6 a film of solidified binding material, for example a blend of copolyamides or a variety of polyvinyl chloride exhibiting a melting point lower than the melting point of the outer layers 4 and 6. In this latter case, the positioning structure and the various elements are arranged on the first outer layer 4 comprising on its surface, a film of solidified binding material, then there is applied the second outer layer 6 also comprising on its internal surface a film of solidified binding material. As in the other variants, a heating press is provided and enables melting the films of binding material and pressing the two outer layers towards one another in order thus to form a card according to the invention. It will be noted that it is also possible in this variant to provide a single solid film on the internal surface of one of the two outer layers 4 or 6.

In the case of the card shown on FIGS. 10 and 11, it will be noted that the method of manufacture of this card is equivalent to the method described hereinbefore. In this latter case, it is well understood that bringing the first outer layer is simultaneous with bringing the positioning structure 112, such first outer layer being formed by base 110 of support 106.

In the last case described hereinbefore, the binding material is applied after bringing in support 106. When the binding material is applied in the form of a solid leaf, this leaf is brought onto the positioning structure 112. In the same manner as previously, the solid binding material may be initially assembled with the outer layer 102. By way of example, the solid binding material is formed by a layer of polyvinyl chloride assembled with the outer layer 102 and exhibiting a melting point lower than the melting point of such outer layer 102.

Figure 8:
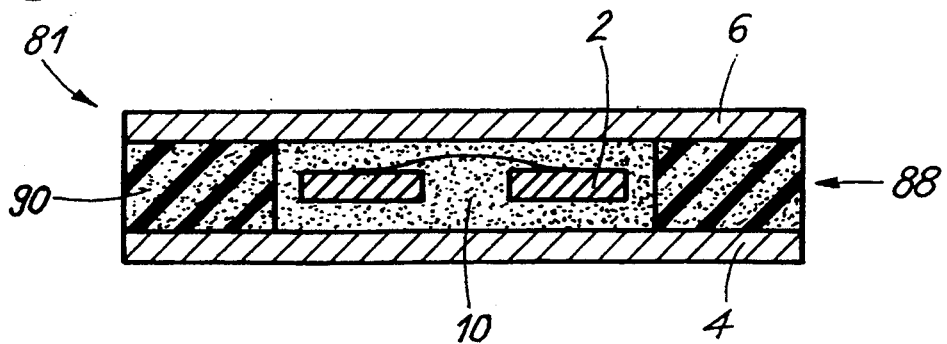
FIG. 8 is a view similar to FIG. 7, but showing a card according to a fourth embodiment of the invention.

It will be noted that in the case of the card shown on FIG. 8, it is possible to apply simultaneously the positioning structure 90 and the binding material 10, which latter can be impregnated in the positioning structure 90 before the latter is brought into play.

According to a third manner of putting into practice the method of manufacture of a card 94 according to the invention, it is foreseen to place at least one electronic element 2 on a work surface and to apply directly onto such work surface a binding material 10. Next, pressure is applied onto the binding material 10 towards the work surface with the help of a press exhibiting a contact surface with binding material 10 until the binding material forms a layer 95 having a predetermined thickness.

The work surface and the contact surface of the press are non-adhesive to the binding material. For example, they are covered over with teflon. It will be noted that the coil and, if necessary, the positioning structure, are brought into play before the step of applying pressure and are integrated in the layer 95 forming card 94.

Again, the positioning structure enables positioning the electronic element 2 and coil 12 in a predetermined internal zone of layer 95. In particular, such structure enables maintaining the electronic element and the coil in such internal zone during the step of applying pressure.

The binding material 10 is applied in liquid form preferably exhibiting a viscosity sufficiently high so as to spread out in a substantial manner only when pressure is applied onto the binding material.

It will be noted that at least a portion of the binding material 10 may be applied, in a variant of this third manner of putting into practice, in the form of at least one solid leaf, such leaf being thereafter at least partially melted in order to form layer 95 containing the electronic element 2, coil 12 and the positioning structure 62.

In this variant, it is possible to place the leaf of binding material directly on the work surface and the various foreseen elements on such leaf of binding material. The application of energy is then preferably provided by the work surface in a manner to melt the leaf of binding material without raising too much the temperature of the various elements.

The variant described hereinbefore is particularly advantageous when no positioning structure is provided. Effectively, if the leaf of binding material is made to melt in a judicious manner in order that it exhibit a soft and deformable, but non-liquid consistency, it is then possible to drive in the electronic element and the coil with the help of the press without them undergoing a significant lateral displacement. Thus, the electronic element and the coil maintain approximately the position in which they have been placed on the leaf of binding material.

It will be noted that what has just been mentioned is also valid in the case of the second manner of putting into practice of the method according to the invention, the leaf of binding material then being arranged directly on the outer layer 4 and the application of heat to the leaf of binding material being effected by the work surface through such outer layer 4. In this ,latter case, it is foreseen that the melting point of the binding material be less than the melting point of the outer layers.

According to a fourth manner of putting into practice of the method of manufacture of a card 1, 31, 61, 81 according to the invention, it is foreseen to manufacture, in a first phase, a card 95 according to the third manner of putting into practice of the method described hereinbefore. Next, in a second phase, two outer layers 4 and 6 are arranged on either side of card 95 in order to form a card 1, 31, 61, 81 according to the invention.

In a first variant, there is foreseen an application of energy serving to melt the card 95 at least superficially in a manner such that the binding material 10 forming such card 95 adheres solidly to the two outer layers following a cooling step.

Thus, card 94 initially manufactured is a constitutive element of a new card 1, 31, 61, 81 for which it forms the intermediate layer 8, 38, 58, 88.

In a second variant of this fourth manner of putting into practice of the method according to the invention, there is foreseen the application of a glue film on the internal surfaces 59 and 60 of the two outer layers 4 and 6 and/or on the two corresponding faces of card 95 forming the intermediate layer 1, 31, 61, 81 of the card manufactured according to this fourth manner of putting into practice, the whole being assembled at ambient temperature.

Here it will be noted that throughout the present text the binding material 10 may be formed from several materials. Likewise, the layer 8, 38, 58, 88, 95 of binding material 10 may be formed of several sub-layers or films of different materials. Thus, in the second variant described hereinbefore, card 95 and the two glue films together form the intermediate layer 8, 38, 58, 88.

In a third variant of the fourth manner of putting into practice of the method according to the invention, it is foreseen to place card 95 as initially manufactured in a frame exhibiting an opening, the profile of which corresponds substantially to that of card 95. Next, the assembly of card 1, 31, 61, 81 according to such third variant is effected with the help of two glue films in a manner similar to the second variant previously described. During application of the glue films, the two faces of the frame respectively situated facing the outer layers 4 and 6 are also covered over by the glue.

It will be noted that the method of manufacture according to the invention enables, in each of its manners of putting into practice, the manufacture of several cards at the same time. In order to bring this about, there is fashioned a plate corresponding to several cards. Such plate is fashioned according to the method of the invention described hereinbefore, a final cut-out step of each card being provided after manufacture of the plate.

In this latter case, it is particularly advantageous to provide a positioning structure having the dimensions of the plate and exhibiting several principal openings distributed with a certain periodicity. Each period is foreseen for one card. In each principal opening is arranged at least one electronic element.

Given that the positioning structure exhibits well defined principal openings serving to position the various elements provided, it is possible, during the cutting out of the cards in the plate, to guarantee that none of the various elements arranged in the principal openings of the positioning structure is cut through or damaged. In order arrive at this, the cut-out profile of the card is chosen in a manner such that such profile never intercepts one of the principal openings of the positioning structure.

It will be further noted that what has just been described remains also true for the manufacture of a single card from a plate having dimensions greater than such card.

It will be noted that during the process of manufacture of a card according to the invention described hereinbefore, a working frame may be arranged on the work surface, the various elements provided in the layer of binding material and the binding material itself being brought to the interior of such working frame. In order to permit removal of an excess of binding material during the step of application of pressure, it is provided that such frame is permeable to said binding material, at least when the latter is subjected to overpressure.

It will be further noted that every known means of applying heat in the manners of putting into practice of the method necessitating such application may be envisaged, for example applying heat by microwaves. In the same manner, every known means of solidification of the chosen binding material may be envisaged, for example polymerization by ultraviolet.

Finally, it is possible without departing herefrom to combine the first or the second manner of putting into practice of the method according to the invention with the third manner of putting into practice of such method in order to manufacture a card according to the invention possessing a single outer layer and a layer formed by the binding material. In the case of FIGS. 10 and 11, such single outer layer corresponds to the support base.

What I claim is

1. A card comprising at least one electronic element and a layer formed by a binding material, said electronic element being embedded in and completely enclosed by said binding material, such card further comprising a positioning structure separate from, but located in the interior of, said layer formed by said binding material, said positioning structure being one piece with at least one dimension being substantially equivalent to at least one dimension of the card, such positioning structure having at least one principal opening defining an internal zone within which said electronic element is located for positioning said electronic element in the interior of said card.

2. A card as set forth in claim 1 further comprising a coil having two ends electrically connected to said electronic element, said electronic element with said coil forming an assembly encased by said binding material.

3. A card as set forth in claim 2 further comprising first and second outer layers, said layer formed by said binding material constituting an intermediate layer between said first and second outer layers, at least the major portion of the internal surface of each of said first and second outer layers being covered over by said binding material, such latter assuring the cohesion of such first and second outer layers with said intermediate layer.

4. A card as set forth in claim 1 further comprising first and second outer layers, said layer formed by said binding material constituting an intermediate layer between said first and second outer layers, at least the major portion of the internal surface of each of said first and second outer layers being covered over by said binding material, such latter assuring the cohesion of such first and second outer layers with said intermediate layer.

5. A card as set forth in claim 4 wherein each of said first and second outer layers is formed by a flat leaf of plastic material.

6. A card as set forth in claim 4 wherein said positioning structure is formed by a thin structure having an upper face and a lower face located facing respectively said first and second outer layers, said thin structure exhibiting on each of said upper and lowe faces a relief composed of several pyramids, the outer points of which are in contact with the outer layer located facing such relief.

7. A card as set forth in claim 1 wherein said positioning structure is formed by a plate in which said principal opening is provided, such plate having its upper face and its lower face entirely covered over by said binding material.

8. A card as set forth in claim 1 wherein said positioning structure is formed by a thin structure exhibiting on its upper face and on its lower face a relief composed of several pyramids.

9. A card as set forth in claim 1 wherein said positioning structure exhibits perforations.

10. A card as set forth in claim 1 wherein said positioning structure is formed by a cellular structure.

11. A card as set forth in claim 1 wherein said positioning structure is formed by expanded material.

12. A card as set forth in claim 1 wherein said positioning structure has the general form of a frame.

13. A card as set forth in claim 1 in which said binding material is formed by a solidified resin.

14. A card as set forth in claim 1 further comprising first and second outer layers, said layer formed by said binding material constituting an intermediate layer between said first and second outer layers, the internal surface of each of said first and second outer layers being completely covered over by said binding material, such latter assuring the cohesion of such first and second outer layers with said intermediate layer.

* * * * *